United States Patent [19]

Barjesteh

[11] Patent Number: 5,240,810

[45] Date of Patent: Aug. 31, 1993

[54] PRE-PRESS PROOFING METHOD

[75] Inventor: Hamid Barjesteh, St. Paul, Minn.

[73] Assignee: Minnesota Mining and Manufacturing Company, St. Paul, Minn.

[21] Appl. No.: 728,311

[22] Filed: Jul. 8, 1991

Related U.S. Application Data

[63] Continuation of Ser. No. 365,908, Jun. 14, 1989, abandoned.

[51] Int. Cl.$^5$ .................. G03C 11/12; G03C 1/805
[52] U.S. Cl. .................................. 430/257; 430/253; 430/293; 430/143; 430/262
[58] Field of Search ............... 430/257, 253, 293, 143, 430/262

[56] References Cited

U.S. PATENT DOCUMENTS

| 3,647,433 | 3/1973 | Contois | 96/1.6 |
|---|---|---|---|
| 4,304,836 | 12/1981 | Cheema | 432/252 |
| 4,376,158 | 3/1983 | Spechler | 430/291 |
| 4,482,625 | 11/1984 | Namiki et al. | 430/143 |
| 4,686,163 | 8/1987 | Ng et al. | 430/124 |
| 4,766,053 | 8/1988 | Shinozaki et al. | 430/256 |
| 4,902,594 | 2/1990 | Platzer | 430/14 |

FOREIGN PATENT DOCUMENTS

| 0286919 | 10/1988 | European Pat. Off. . |
| 0294665 | 12/1988 | European Pat. Off. . |
| 61-286857 | 12/1986 | Japan . |

Primary Examiner—Cynthia Hamilton
Attorney, Agent, or Firm—Gary L. Griswold; Walter N. Kirn; Mark A. Litman

[57] ABSTRACT

Most prepress color proofing systems require the use of special receptor sheets. The differences between the special sheets and the final print sheet can affect the desired color balance. The use of a proof image on a temporary transfer sheet, with an adhesive layer between the image and a final receptor layer, enables the use of essentially any printing stock or printing surface as the final proofing image substrate.

25 Claims, No Drawings

PRE-PRESS PROOFING METHOD

This is a continuation of application Ser. No. 07/365,908 filed Jun. 14, 1989, now abandoned.

BACKGROUND OF THE INVENTION

1. Field of the Invention

The present invention relates to prepress color proofing methods and materials which can be used for generating images on any available printing stock.

2. Background of the Art

In printing pictorial matter, whether by lithography, letterpress or gravure, the halftone process is used, wherein the actual printing image is composed of thousands of minute dots per square inch of a single color ink of varied dot size or ink density. What the naked eye sees as shading in halftone prints as actually a controlled variation in the size of dots relative to the unprinted areas between the dots. In black and white pictorial matter the dots are printed in black ink only. Full color reproductions, however, are necessarily printed in each of at least three colors, cyan, magenta, and yellow (known as "three color process"), or in these same colors with the addition of black ("four color process"). For each color a printing plate is made. In order to make the three or four printing plates, the original color picture or photograph is "separated" photographically, with the use of filters, masks, etc., into a set of three or four halftone negatives, each representing one of the colors, and containing, dot for dot, the amount of that color which must be printed to produce the desired total color print.

The preparation of the color-separation negative is an art and requires considerable skill in handling the many variables to produce a desired result. Often trial and error is involved requiring correction or replacement of one or more of the negatives. Unless some reliable system is available to "proof" the negatives, the printing press must be set up and copy printed just to secure preliminary proofs. This is time consuming and expensive. It is therefore desirable to provide accurate means for proofing the negatives without printing.

One system for proofing color separation negatives is disclosed in U.S. Pat. No. 3,136,637. A light-sensitive transparent sheet is provided for each of the colors to be printed. Each of the sheets is exposed through its respective color separation negative. Upon processing, the color in the non-image areas is removed, yielding a sheet which contains the desired color pattern in the image areas, while being colorless and transparent in the non-image areas (e.g. between halftone dots). After each of the separate sheets is made, they are assembled together in registry on a white background, whereupon a color proof results.

That system of color proofing has a number of inherent drawbacks. For example, the laying up of the multiplicity of sheets requires that the viewer look through a plurality (three or four) of transparent films during the proofing operation. Since the composite is made of several separate sheets, extreme care is required to maintain registry. If the individual sheets are not perfectly colorless and transparent in the optical sense, any "haze" or imperfection present is multiplied in the several sheets. Additionally, incident light reflects from the several sheets imparting a gloss which is not truly representative of printed copy, thus introducing a need for interpretation in evaluating the proof.

U.S. Pat. No. 3,671,236 improves upon the proofing system described in U.S. Pat. No. 3,136,637. Photomechanically produced images corresponding with each color are integrally built up on a single substrate (much as occurs in the actual printing operation itself) without any printing operations. The multiplicity of carrier films is eliminated by transferring individual color images from a sheet comprised of 1) a carrier with release surface, 2) pigment and binder layer, 3) photohardenable or insolubilizable layer, 4) barrier layer and, 5) pressure-sensitive adhesive layer.

U.S. Pat. No. 4,656,114 provides a thermally transferable prepress proofing sheet by using thermal adhesives, particularly acrylic adhesives, that do not discolor during imaging of the sheet and is non-tacky at room temperature.

U.S. Pat. No. 4,497,889 describes compounds which can be added to negative acting photopolymerizable compositions to improve their release properties. The compositions can be resistively developed in aqueous or organic solvent systems. Testing procedures for the peel forces are described.

In the above mentioned art, special bases must be used for the following reasons: (1) Coated paper stock must be used to prevent the adsorption of the developer solution during processing. The developer would discolor and distort the paper preventing good registration of the color images. (2) Thick paper stock must be used to prevent wrinkling and distortion during lamination. (3) A highly reflective layer is present to give a standard whiteness (which is not desirable in all cases as will be seen). The use of this special base means that the final assembled proof does not match the printed page in visual color, texture, or feel as most printed jobs are not on heavy, white, plastic coated papers. It is highly desirable for the final proof to match the expected press printed copies as close as possible as it leaves less interpretation of the differences seen in the proof by the operator of the printing press.

U.S. Pat. No. 4,482,625 discloses a process for the preparation of a color proofing sheet in which a multicolor proofing image is formed and the image is placed in a photopolymerizable composition, the composition transferred, and the composition photopolymerized and hardened.

U.S. Pat. No. 4,686,163 discloses a process for transferring a multicolor electrostatically toned image onto a permanent receptor. The multicolor toned image is formed on a first support and is itself transferred to a second support.

SUMMARY OF THE INVENTION

Negative or positive proofs are assembled on a carrier surface with an adhesive layer available for transfer or adherence of the proof to a surface. The assembled proofs can then be transferred and adhered onto the final printing stock. The use of the adhesive on the composite assembly allows for essentially any printing stock to be used as the receptor sheet.

DETAILED DESCRIPTION OF THE INVENTION

The various processes contemplated in the practice of the present invention may be summarized as follows. A multicolor proofing image is constructed on a first surface. That first surface may either be (1) a release surface from which the full multicolor image may be stripped, or (2) a thermoplastic adhesive layer on a strippable carrier sheet. If the first surface is a release surface, the full multicolor proofing image is then contacted with and adhered to a thermoplastic adhesive layer on a strippable carrier layer to transfer the image to the adhesive layer. If the transferred image (after removal from the release surface) provides a surface adhesive layer (as is usually the case with most negative acting color proofing systems such as Matchprint ™ Negative Color Proofing Film), that surface adhesive layer is used to adhere the proofing image to a printing stock surface. After adherence to the printing stock surface, the strippable carrier layer on the thermoplastic adhesive may be stripped from the adhesive. The thermoplastic adhesive exposed by the stripping step can then act as a protective layer, may be used to thermally adhere an additional protective layer to that surface (by lamination), or may be used to thermally adhere an optically modifying layer (matting layer, diffusive layer, anti-reflective layer, etc.) that to surface.

If the first surface on which the multicolor proofing image is constructed is the thermal adhesive layer on a strippable carrier sheet, a variety of other process steps are available. A second thermal adhesive layer on a strippable carrier sheet may be brought into contact with the proofing image (the second adhesive layer of course being in contact with the image). This provides an image sandwiched between two adhesive layers and carrier sheets. Either carrier sheet may then be stripped away to provide a right-read or wrong-read (reverse-read) image to be laminated onto a printing stock. By initiating separation of one strippable carrier from one adhesive, either read of the image may be laminated to a printing stock. After such lamination, the other strippable carrier layer may be removed and further lamination to that surface may be performed. As in the previous case, an abrasion protective layer or optical modifying layer may be adhered to that adhesive.

In the case where a positive color proofing image is first constructed on a temporary carrier (or a negative image with no adhesive on the side facing the carrier), the B sheet (the adhesive in the strippable carrier layer) must be then adhered to the proofing image to provide transfer properties to the image. The image may then be transferred by removing the strippable carrier layer from the adhesive with the image thereon and laminating that adhesive to a print stock. A second thermal adhesive on a strippable carrier layer may be adhered to the image bearing surface prior to lamination or after lamination.

The present invention can use any negative or positive acting transfer proofing systems. Such commercial systems such as Negative Matchprint ® color proofing sheets, Positive Matchprint ®, and the like can be used in conjunction with the materials and processes of this invention.

The present process offers a number of advantages, not the least of which are that (1) The proofs do not require expensive final supports, (2) The proofs can be on the same substrate as the final printing job, (3) The process allows a wider exposure latitude since the exposure step is not performed with a highly reflective support as in many commercial processes, and (4) There is a cost savings. (5) With the new "B" Sheet it is possible to transfer both the coated adhesive as well as color to the final printing stock. We can thus provide to the proof a protection layer bonded to the adhesive that will allow us to degloss the positive transfer system which could not degloss before. The new "B" Sheet will work with both Negative and Positive system and hence no need for a different "B" Sheet for Positive or Negative system. (6) The extra adhesive coating on the top layer of finished proof will give us an extra 2 to 3% additional dot gain in black half tone area. By having the "B" Sheet the same size as the color proofing materials, the new "B" Sheet can be used in automatic proofing machine. The use of the process of the present invention with the new "B" sheets has also been found to improve D-Max (better contrast), provide better protection from static build up, enable better deglossing characteristics on the finished proof, eliminate the need for front or side registration of the laminator, eliminate the need to mask or score an area around the image to facilitate a clean transfer, and it provides a system which is much easier to use and is very reliable. By laminating a "B" sheet with an image to another "B" sheet, the image can be transferred to any of the two "B" Sheets by placing the desired side down and pulling the other "B" Sheet off. Hence a mirror image or a reverse side image can be produced.

The process of the present invention comprises a method for generating a prepress color proof having the steps of forming a proof halftone image of at least two colors on a temporary receptor, carrier, or transport sheet, contacting said proof image with a final receptor sheet with a continuous (dry, preferably not tacky, at least non-aggressively tacky) adhesive layer between said proof image and said final receptor sheet, bonding said proof to said final receptor sheet, and removing said temporary sheet leaving an adhesive layer on top of the finished proof.

In its broadest terms the process of the present invention may be described as forming a composite color proofing image of at least three different colors (preferably at least four different colors) on a release surface in the proper or reverse order from which the colors are intended to be viewed, providing an adhesive (preferably thermal adhesive) layer over or under the composite image, and then transferring the composite image and adhesive layer off the surface and onto a receptor surface, bonding the composite proofing image to the receptor with the adhesive layer.

In negative acting systems, the images of three or four (e.g., cyan, yellow, magenta and black) separation image layers are deposited onto a temporary receptor sheet. The individual layers are secured to the receptor sheet by adhesive layers that ordinarily face the receptor sheet. The composite image (including the intermediate and lowermost adhesive layers) are transferred to a temporary or intermediate transfer sheet. If the lowermost adhesive layer is transferred as the uppermost layer on the temporary or intermediate transfer sheet, that adhesive layer may be used to adhere the composite to a final receptor sheet, which may be any print stock or paper. If the lowermost adhesive layer on the temporary or intermediate receptor sheet is not transferred or becomes weakened in the process, a topcoat adhesive layer may be applied to the composite image on the temporary or intermediate transfer sheet before the transfer to the final receptor sheet is made.

Preparation of a final prepress color proof from positive-acting single sheet proofs according to the present invention can be prepared by essentially identical transfer and adherence process steps as were the negative single sheet proofs. Again, the important final step is to associate the surface of the composite proofing image with an adhesive layer (preferably directly on the surface, less preferably on the receptor surface) at the time of transfer to the final receptor sheet.

In the practice of the present invention there are a number of materials and articles which are not commercially available and which are important to the practice of the present invention. In particular, various combinations of an intermediate receptor sheet (which may be referred to herein as an "A Sheet") disclosed in U.S. Ser. No. 100,603, filed Sep. 24, 1987, an intermediate transfer sheet (which may be referred to herein as a "B Sheet"), and a transferable dry film thermal adhesive (which may be referred to herein as a "C Sheet") are used in the process of the present invention. Examples of useful constructions and descriptions of these sheets are provided below.

A Sheet (disclosed in U.S. Ser. No. 100,603, filed Sep. 24, 1987)

This sheet may comprise, for example, a carrier film coated with a reusable release layer. The carrier may be made of numerous materials such as paper or polymeric materials. The preferred material for use in this invention is a film of biaxially oriented, poly(ethylene terephthalate) (PET). The preferred thickness for this film is 178 micrometers (preferably 76–635 micrometers) for dimensional and thermal stability. Any release surface or layer may be used. The preferred release layer is composed of a solvent soluble thermoplastic resin, a solvent soluble thermoset resin with a malamine crosslinker and a catalyst. The preferred thermoplastic resin is a linear saturated polyethylene-glycol-terephthalate, such as BOSTIC 7695. The preferred thermoset resin is an ortho-phthalate ester system with a melamine crosslinker, such as HKR-180 or HKR-185 from Hydro Kinetics Inc. The preferred catalyst is p-toluene sulfonic acid. The workable range for the release force is about 100 grams/19 millimeters to 180 grams/19 millimeters with the preferred range of 130–140 grams/19 millimeters for the positive system. The coating weight may be from 0.538 to 5.38 grams/sq. meter, and preferably from 1.08 to 3.23grams/square meters. The more preferred coating weight is 2.15 grams/sq. meter.

B Sheet

1. A PET (polyethylene terephthalate) carrier film is preferably 64 to 508 micrometers thick, and is 102 micrometers thick in the examples of this patent. This is the preferred thickness for thermal transfer properties.

2. The release force between the adhesive and the PET film generally has a workable range of about 4 to 8 grams/19 millimeters (although 0.1 to 0.6 grams/mm may be used). The preferred release force range is 5 to 7 grams/19 millimeters for both negative and positive systems.

C Sheet (disclosed in U.S. Ser. No. 100,603, filed Sep. 24, 1987)

This sheet generally consists of a carrier film and a coating of a thermally transferable adhesive of 25.4 micrometers to 254 micrometers. The preferred film is a 50.8 micrometers thick PET film. The thermal adhesive coating consists for example of either a single thermoplastic resin or a blend of thermoplastic resins that are solvent soluble and a plasticizer. The preferred adhesive is a blend of styrene/butadiene copolymer such as Pliolite S5A and styrene/acrylate copolymer such as Pliolite AC (Pliolites are available from Goodyear) and N-ethyltoluene-sulfonamide, e.g. "Santicizer 8" from Monsanto. The workable coating weight range is 2.15–10.76 grams/square meters with the preferred range from 3.23–5.38 grams/sq. meter. The release force desired is about 1000–1800 grams/19 millimeters.

When the Negative or Positive proof has been completed on the "A" sheet, the top layer is composed of a mixture of image areas and background areas. This top layer is the surface that comes in contact with the "B" sheet and is required to adhere to it so that the "A" sheet can be removed after the lamination step. When the proof is transferred to the paper or other final receptor surface, the top layer is required to cleanly release from the "B" sheet as the carrier layer is peeled away. The nature of the resins in this top layer can be significantly different between Matchprint TM Negative and Matchprint TM Positive. For the negative system, this top layer preferably consists of pigmented poly(vinylformal) in the image areas and Lucite TM (acrylic resin; polymethyl methacrylate) in the background areas. For the positive system this top layer may consist of pigmented phenolic resin in the image areas and Pliolite TM (styrene/acrylate copolymer) in the background areas. The softening points of the resins that make up these surfaces in a positive proof is preferably lower than the softening points of the resins that make up these same surfaces in the negative system as described in U.S. Ser. No. 100,603, filed Sep. 24, 1987. In this invention a set of "A" and "B" Sheet with the same coating formulation and peel force, one can transfer both negative or positive systems.

At times it is desirable to transfer a proof directly to the paper from the "A" sheet. This can be accomplished by the use of sheet "B". The paper (receptor sheet) to be used is prepared to accept the proof by first laminating the thermal adhesive from sheet "B" to it. The paper having the adhesive layer on it will now readily accept the proof directly from the "A" sheet. The reason this adhesive is required is that when the completed proof is still on the "A" sheet, the top layer that is to go to the paper has no adhesive on it, in the case of the negative system. In the case of the positive system, even though the background areas are thermal adhesive there are image areas that have little or no thermal adhesive. The adhesive from the "B" Sheet may also be laminated to the composite proof on the A Sheet and the coated composite transferred to a receptor sheet.

There may be reasons for desiring to transfer the composite image directly from the A Sheet rather than going through the intermediate transfer step with a B Sheet. Depending upon the order in which the separation color images are laid down, it may or may not be desirable to have an additional transfer step. Each transfer step will reverse the color ordering and the left-right orientation of the image. If the printed image were to printed as cyan-magenta-yellow-black and the proof images were laid down as black-yellow-magenta-cyan, only a single transfer step would be desired.

As the printing stock does not have to be passed through the chemicals of the processor, the printing stock does not have to be made impervious to the processing solutions via the usual polyethylene layers present on both sides of the currently marketed proofing bases. Also as the final image is transferred in at most two steps, the dimensional stability of the printing stock when subjected to the temperature, pressure, tension of the usual lamination between each additional color transferred is not required. Thus in the instant invention an expensive base, dimensionally stable to humidity, heat, pressure, coated with highly reflective materials such as barium sulphate and coated with polyethylene is not required.

The advantages of this invention include the ability to prepare proofs on any support made of paper, plastic, or metal which can pass through a lamination step to effect the transfer of the final composite image from a temporary support (yet to be described) to that support. Thus the final proof from this invention, being on the same support as the intended press printing support (paper) will look and feel the same as the press printed copies.

These and other aspects of the invention will be shown in the following non-limiting examples.

EXAMPLE 1

An adhesive composition is prepared by mixing Elvacite 2044 (Dupont) 6% solids by weight, VAGH (Union Carbide) 2% solids by weight, and methyl ethyl ketone 92% solvent. This solution was coated by using a Meyer bar onto 2, 3 and 4 mil polyethylene terephthalate (PET) film at a wet coating weight of 375 mg/ft$^2$. The coating was dried in an oven for 2 minutes at 104° C.

EXAMPLE 2

An adhesive composition is prepared by mixing an Acrylic Latex #26314 (B.F. Goodrich) 56.6% by weight, an Acrylic Latex #26106 (B.F. Goodrich) 13.8% by weight, deionized water 29.5% by weight, KOH to adjust pH to 5.5, Acrysol ASE-95 (Rohm & Haas) 0.1% by weight, and Beads MMA) Syloid 378 0.2% per solids total. This solution was coated by using a Meyer bar onto 2, 3 and 4 mil polyethylene terephthalate (PET) film to a coating weight of 375 mg/ft$^2$. The coating was dried in an oven for 2 minutes at 104° C.

EXAMPLE 3

The above composition of Example 2 was coated by using a Meyer bar onto 2, 3 and 4 mil polyethylene terephthalate (PET) film to a coating weight of 375 mg/ft$^2$. After the coating was dried in an oven for 2 minutes at 104° C., the composition of Example 1 was coated on top of this dried material. The coating was dried again in an oven for 2 minutes at 104° C. (combination of Example 2 and 3 coatings).

EXAMPLE 4

A prepress positive color proof was made in the following manner.

Transfer Matchprint TM Positive commercially available positive-acting proofing sheets were used in this example. A commercially available laminator, MR 447 (heat and pressure laminator, operating at about 0.4 kg/cm$^2$ pressure, 132 degrees Celsius, at 0.8 meters/minutes) was used.

The first color Transfer Matchprint TM Positive sheet (black) was placed on the top feedtray of the laminator, coated side down. Transfer sheet A was placed on the lower feedtray with the release surface up and the sheets laminated by conventional laminator operation. The laminated proofing sheet was then placed in an exposure frame. The base made of an original film (or black separation) was placed on the laminated proofing sheet. A vacuum was drawn and the proofing sheet exposed through the original film under standard exposure conditions for Transfer Matchprint TM Positive. The imaged material was removed from the frame and processed in a commercial developer to wash off the exposed areas. The transfer sheet A with the developed image on it was then placed in the lower feedtray of the laminator with the image facing up. The second color prepress proofing sheet (cyan) was placed on the top feedtray of the laminator with the coated side down. Lamination, imaging and developing were repeated. Further images were expected with magenta and yellow layers in sequence to form a four-color proof.

The Transfer sheet "B" was placed on the upper feedtray of the laminator with the adhesive face down. The intermediate four-color proof on Transfer sheet A was placed in the lower feedtray, colored side up and the sheets laminated. The transfer sheet A was removed from the final proof image and saved for subsequent use. The final four-color proof is on the adhesive on the strippable carrier layer in a wrong reading orientation.

EXAMPLE 5

A four-color prepress color proof was generated with Transfer Matchprint TM Negative in very much the same manner as with the Positive Matchprint proofing system of Example 3 except that an intermediate transfer sheet B is used. The color laydown order was cyan, magenta, yellow, and black on the transfer sheet A. The four-color negative image is then transferred to intermediate sheet B and finally laminated to paper stock with the adhesive from the B sheet, removing all temporary carrier sheets used in the process. The final sequence of colors matches the standard printing color laydown.

EXAMPLE 6

A three-color prepress proof was generated using T-NAPS TM color proofing film (American Hoechst Corp., Enco Printing Products) using the instructions supplied with the film. The proof was assembled on an A Sheet in place of the T-NAPS transfer color proofing receiver base. The materials were laminated in an MR 447 laminator (3M), and exposures were made emulsion to emulsion to make a right reading proof. The colors were processed by hand using NAPS/PAPS developer. The assembled proof on the temporary receptor layer was transferred to the B sheet using the laminator. The A Sheet was then removed, exposing a layer of adhesive already present in the T-NAPS material. This adhesive layer was placed in contact with a sheet of King James Coated-One-Side gloss cover (James River Paper) and laminated. The B Sheet strippable layer was then removed to give a finished three-color proof leaving an adhesive layer on the surface of the proof. This adhesive layer would then be used to laminate other layers to the surface of the proof.

EXAMPLE 7

A four-color prepress proof was generated using the Positive Chromalin ® color prepress proofing system (DuPont Photo Products Dept.) as described in the literature provided with the system. The intermediate proof was assembled on an A Sheet rather than the regular receptor sheet. The color order of assembly was yellow, magenta, cyan and black. After the steps of laminating (on the MR 447), exposing (base to emulsion to obtain a right reading proof), and toning for each color, the resulting four-color assembling could be transferred to a B sheet. The A Sheet could then be removed to give a four-color proof on the adhesive surface.

EXAMPLE 8

This example shows the ability of this invention to provide proofing images on irregular, e.g., curved surfaces (with radius of curvature of less than 0.75 meters) after assembly on a temporary receptor. Samples of the assembled image of Example 4 were wrapped around a quart can and a quart bottle (both having regular, circular cross sections) with the adhesive from the B sheet facing the can and bottle. The intermediate proofs were heated with a hair dryer until the surfaces were quite warm to the touch and then allowed to cool. The A Sheets were then removed, leaving a proofing image on the irregular substrates that approximated the results of a direct printing operation on those surfaces.

EXAMPLE 9

A four-color prepress negative proof was generated very much in the same manner as Example 4 except that an intermediate transfer sheet "B" is used. The color laydown order was cyan, magenta, yellow and black on the transfer sheet "A". The four-color negative image is then transferred to intermediate sheet B and finally laminated to another sheet "B". The resulting four-color prepress proof is sandwiched between two "B" sheets. At this point the image can be retained on either B sheet, simply by placing the proof either right reading or wrong reading side up. The top B sheet is then peeled off. The image retained on the bottom B sheet is then transferred to the paper, resulting in either a right or wrong reading image.

EXAMPLE 10

A proof made as in Example 9, but the initial four-color proof is made directly onto a B sheet rather than on an A sheet.

Examples of photosensitive color prepress proofing sheets which are useful in the practice of the present invention are well known in the marketplace and the patent literature. Examples of such systems are shown in U.S. Pat. Nos. 3,136,637; 3,671,236; 4,260,673; 4,666,817; and 4,656,114.

Examples of actual instructions used in the practice of the present invention are described below.

A negative-acting film was constructed as follows.

A more general description of the sheets used in U.S. Pat. No. 4,656,114 is a 2-mil film of smooth-surfaced biaxially oriented polyethylene terephthalate polyester is first coated with a polyvinyl alcohol solution constituted as follows:

|  | Parts by wt. |
| --- | --- |
| Polyvinyl alcohol (available commercially as Gelvatol 20-30/Gelvatol 20-90 (3/1)) | 2.5 |
| Glycerin | 0.5 |
| Water | 97.0 |

A dry coating weight of 75 mg/ft$^2$ provides a satisfactory release layer. The release layer surface is oven dried and then overcoated with a resin solution containing a suitable transparent yellow pigment.

The coating solution is prepared by first dispersing the pigment into 1,1,2-trichloroethane solvent, and adding polyvinylformal resin (Formvar 15/95 E), the amount of the ingredients being adjusted to yield a mix having 65 parts resin, 35 parts pigment, and 900 parts solvent. This mix is appropriately milled. The resultant mill base is then diluted by adding further solvent to yield approximately a 3 percent solids. This pigmented-resin coating solution or dispersion is applied over the dried release layer at a dry coating weight of about 20–70 milligrams per square foot. The coated sheet construction is oven dried as before the evaporate the solvent.

The polyvinyl formal coated side of the sheet is then primed by a corona discharge treatment, sufficient to render the surface of the film water-wettable.

A solution of a light-sensitive diazo resin or equivalent is then coated over the primed surface of the sheet. A preferred diazo resin is the condensation product of p-diazodiphenylamine and formaldehyde, prepared, for example, in accordance with the method described in U.S. Pat. No. 2,714,066. A solution of the pure diazo resin, for example, 4 parts resin dissolved in 48 parts water and 12 parts methanol, is made up.

The preparations of the light-sensitive diazo resin are carried out under subdued light, for example, under a yellow light. This is also true of the other operations involving the coating of the sheet with the light-sensitive resin and subsequent handling of the sensitized sheet prior to exposure and development.

The solution of the light-sensitive, diazo resin just described may be applied over the primed polyvinylformal layer by roll-coating or by dipping the sheet into the solution of the resin. It is preferred that the diazo coating be thin, a residue of about 6–8 milligrams of the diazo resin per square foot of area being satisfactory, although the precise amount is not particularly critical with amounts of 3–50 mg/ft$^2$ being useful. The sheet is then air dried at room temperature, or at slightly elevated temperatures if desired. A barrier is applied over slightly elevated temperatures if desired. A barrier is applied over the diazo layer, for example, by coating a two percent weight solution in methyl ethyl ketone of a 3:1 weight ratio of poly acrylate ("Elvacite TM 2044") and a polyvinyl chloride-acetate copolymer ("Vinylite VAGH") at a dry coating weight of 100–400 mg/ft$^2$ is preferred).

A clear colorless thermally laminable adhesive is coated on the acrylate surface at a dry coating weight of 800 mg/ft$^2$. Following drying, a protective liner of polyethylene coated paper is not necessarily but may be placed against the adhesive to facilitate handling of the sheet and to protect the adhesive from dirt, etc. In this form the light-sensitive sheet can then be converted into standard sizes, packed in suitable light-proof containers and shipped in commerce. The adhesive may be coated in much greater quantities, a general range being from about 100 to 1200 mg/ft$^2$. The adhesive used was a (60/40) copolymer of n-butylacrylate/ethyl acrylate.

A mixture of a yellow pigment having an average particle size of 0.51 microns [AAOA] and a yellow pigment having an average particle size of 0.11 microns [AAOT] were Meyer bar coated to give a density of 1.08 using the blue filter position of a reflection densitometer (X-rite).

It is also possible to use the barrier layer of U.S. Pat. No. 3,671,236 as an adhesive (thermal adhesive) layer. In fact, this can provide a simplified instruction for use in the present invention. That construction would have a carrier layer, photosensitive diazo layer with pigments therein, and a thermal adhesive/barrier layer presensitized color-proofing sheet comprising a carrier sheet having a release surface, a continuous color coating of pigmented organophilic hydrophobic water-insoluble resinous polymer softenable and/or partially dissolvable in a solvent developing medium, said color coating being in intimate clinging engagement with but not adhesively bonded to said release surface, a light-sensitive diazo resin soluble in said solvent developing medium directly associated with said color coating, said direct association being at least one of the following:

(a) the incorporation of said diazo resin in the color coating to form a single layer; and (b) the incorporation of said diazo resin in a layer separate but contiguous to the color coating layer, a continuous, water-insoluble, transparent, colorless barrier layer bonded on one surface over said color coating and said diazo resin, said barrier layer being insoluble in said solvent developing medium, the diazo resin becoming insolublilized and firmly bonding said color layer to said barrier layer in the light-struck areas upon light exposure of said sheet, the color layer and diazo resin being readily removable from said barrier layer in areas not light exposed and over said barrier layer a thermally-laminable adhesive layer comprising a layer of at least one acrylic polymer or copolymer which is laminable at a temperature between 100 and 150 degrees Celsius at a pressure of 0.29 kg/cm$^2$ in 10 seconds, non-tacky at room temperature, will not discolor or alter its optical density by as much as 0.05 optical density units when exposed to sufficient ultraviolet radiation having a majority of the radiation distributed over the range of 350 and 450 nm to enable an image to be developed from activation of the diazo resin and have no ingredients capable of migrating through said barrier layer and desensitizing said diazo resin, discoloring said pigment, or distorting the optical properties of the other layers.

Amongst the commercially available printing stocks (including paper, coated paper, polymer and metal bases) which have been used as the final receptor surface are Scott Tissue ® Brand 05102 (Scott Paper Co.), Dacon Newsprint, 3016 (Pacon Corp.), St. Regis Text Web, 60 pound proofing paper (Champion Paper Co.), Beckett Hi-White Text TM, 70 pound smooth (Beckett paper Co.,), Consolith TM No. 3 enamel gloss, 70 pound (Consolidated Paper Co.), King James Coated-One-Side 8 point gloss cover (James River Paper), Kimdura TM Base FPG 250 (Kimberly-Clark), Baryta sase, 250 microns thick (Intermills Industries Steinbeck), and smooth grain, lithographic plate aluminum base, 0.15 mm thick (Alcoa Aluminum).

I claim:

1. A process for generating a prepress color proof having the steps of
   a) forming or transferring a proof halftone image of at least two different colors on a temporary receptor or carrier sheet, said proof halftone image having a first continuous layer of thermal adhesive between said proof halftone image and said temporary receptor or carrier,
   b) contacting said proof image with a final receptor sheet with a second continuous adhesive layer between said proof and said final receptor sheet,
   c) bonding said proof to said final receptor sheet, and
   d) removing said temporary receptor or carrier sheet, exposing said first continuous layer of adhesive over said proof.

2. The process of claim 1 wherein said proof image is a positive image.

3. The process of claim 2 wherein said first adhesive layer is first laminated to said final receptor sheet prior to contacting said proof to said final receptor sheet.

4. The process of claim 3 wherein said first adhesive layer is thermally laminated to said final receptor layer.

5. The process of claim 4 wherein at least four different colors are present in said proof image.

6. The process of claim 4 wherein there is at least one continuous adhesive layer adjacent each of said at least two color forming said halftone image.

7. The process of claim 2 wherein said first adhesive layer is laminated to said final receptor sheet at about the same time said proof is contacted to said receptor sheet.

8. The process of claim 7 wherein at least four different colors are present in said proof image.

9. The process of claim 1 wherein forming of said proof halftone image is done by sequentially laminating, exposing and developing each color halftone image.

10. The process of claim 1 wherein forming of said proof halftone image is done by sequentially exposing, laminating, and developing each color halftone image.

11. The process of claim 1 wherein said final receptor sheet comprises a curved surface with a radius of curvature of less than 0.75 meters.

12. A process for providing a prepress color proof comprising the steps of
    a) forming a negative proof halftone image of at least two different colors on a temporary receptor sheet,
    b) directly contacting said proof image with a thermal adhesive on a strippable carrier layer and adhering said proof image to said thermal adhesive, and
    c) removing either said temporary receptor sheet or said strippable carrier layer.

13. The process of claim 12 wherein the forming of a negative proof halftone image is done so that a strippable adhesive layer is on said temporary receptor sheet, said strippable adhesive layer being removable from said receptor sheet when said image is removed.

14. The process of claim 13 wherein said temporary receptor sheet is removed from said proof image after transfer of the proof image to said temporary carrier sheet and before said proof image is contacted with said final receptor sheet with a continuous layer of adhesive on top of the proof image.

15. The process of claim 13 wherein a continuous adhesive layer is present on the surface of said proof image prior to contacting said proof image with said receptor sheet.

16. The process of claim 12 wherein a continuous adhesive layer is present on the surface of said proof image prior to contacting said proof image with said final receptor sheet.

17. The process of claim 16 wherein said proof image comprises at least four colors.

18. The process of claim 12 wherein there is at least one continuous adhesive layer adjacent each of said at least two colors forming said halftone image.

19. A process for providing a prepress color proof comprising the steps of
    a) forming a positive proof halftone image of at least two different colors on a temporary receptor sheet,
    b) contacting said proof image with a thermal adhesive on a strippable carrier layer and adhering said proof image to said thermal adhesive, and
    c) removing either said temporary receptor sheet or said strippable carrier layer.

20. The process of claim 19 wherein a second thermal adhesive layer carried on a strippable carrier layer comprises said temporary receptor sheet.

21. The process of claim 19 wherein there is at least one continuous layer adjacent each of said at least two colors forming said halftone image.

22. The process of claim 19 wherein said formed images are between two thermal adhesives strippably bonded to carrier layers.

23. A process for generating a prepress color proof having the steps of
- a) forming or transferring a proof halftone image of at least two different colors on a temporary receptor or carrier sheet having only a first continuous thermal adhesive layer adjacent said image and between said image and said temporary sheet,
- b) contacting said proof image with a final receptor sheet with a second continuous thermal adhesive layer between said proof and said final receptor sheet,
- c) bonding said proof to said final receptor sheet, and
- d) removing said temporary receptor or carrier sheet, exposing said first adhesive layer as a continuous layer of adhesive over said proof.

24. The process of claim 23 wherein said second adhesive layer is first laminated to said final receptor sheet prior to contacting said proof to said final receptor sheet, and said proof image is a positive image.

25. The process of claim 23 wherein said adhesive layer is laminated to said final receptor sheet at about the same time said proof is contacted to said receptor sheet.

* * * * *